(12) United States Patent
Watanabe (10) Patent No.: US 12,040,748 B2
(45) Date of Patent: Jul. 16, 2024

(54) OSCILLATION CIRCUIT AND SENSOR DEVICE

(71) Applicant: SEIKO EPSON CORPORATION, Tokyo (JP)

(72) Inventor: Jun Watanabe, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 392 days.

(21) Appl. No.: 17/471,563

(22) Filed: Sep. 10, 2021

(65) Prior Publication Data

US 2022/0085760 A1 Mar. 17, 2022

(30) Foreign Application Priority Data

Sep. 11, 2020 (JP) ................................ 2020-152488

(51) Int. Cl.
| | |
|---|---|
| H03B 5/36 | (2006.01) |
| G01D 5/24 | (2006.01) |
| H03B 5/06 | (2006.01) |
| H03B 5/32 | (2006.01) |
| H03K 19/20 | (2006.01) |

(52) U.S. Cl.
CPC ............ *H03B 5/36* (2013.01); *G01D 5/2405* (2013.01); *H03B 5/06* (2013.01); *H03B 5/32* (2013.01); *H03K 19/20* (2013.01); *H03B 2200/0022* (2013.01)

(58) Field of Classification Search
CPC .... H03B 5/36; H03B 2200/0022; H03B 5/06; H03B 5/32; G01D 5/2405; H03K 19/20; G01P 15/097

USPC ................. 331/158, 116 FE, 175, 182, 183; 340/505; 73/504.12
See application file for complete search history.

(56) References Cited

U.S. PATENT DOCUMENTS

| | | | |
|---|---|---|---|
| 7,845,063 B2 * | 12/2010 | Kawashima | ......... H03H 9/1021 |
| | | | 29/609.1 |
| 8,816,786 B2 * | 8/2014 | Tham | ...................... H03B 5/06 |
| | | | 331/109 |
| 2001/0033122 A1 | 10/2001 | Satoh | |
| 2002/0158698 A1 | 10/2002 | Gumm | |
| 2004/0189413 A1 * | 9/2004 | Satoh | ................... H03K 3/0307 |
| | | | 331/158 |
| 2011/0037526 A1 | 2/2011 | Sato et al. | |

FOREIGN PATENT DOCUMENTS

| | | |
|---|---|---|
| JP | 06-125223 | 5/1994 |
| JP | 2001-217652 | 8/2001 |
| JP | 2001-308641 | 11/2001 |
| JP | 2002-368541 | 12/2002 |
| WO | 2009/113657 | 9/2009 |

* cited by examiner

*Primary Examiner* — Arnold M Kinkead
(74) *Attorney, Agent, or Firm* — Rankin, Hill & Clark LLP (57) ABSTRACT

The oscillation circuit includes a drive circuit and an amplitude limiting circuit. A vibrator-output signal is input to the drive circuit from one end of the vibrator, and the drive circuit outputs a drive signal obtained by inverting the vibrator-output signal. The amplitude limiting circuit is disposed between an output node of the drive circuit and the other end of the vibrator, and outputs an amplitude-limited drive signal obtained by reducing an amplitude of the drive signal to the other end of the vibrator.

18 Claims, 9 Drawing Sheets

FIG. 10

OSCILLATION CIRCUIT AND SENSOR DEVICE

The present application is based on, and claims priority from JP Application Serial Number 2020-152488, filed Sep. 11, 2020, the disclosure of which is hereby incorporated by reference herein in its entirety.

BACKGROUND

1. Technical Field

The present disclosure relates to an oscillation circuit, a sensor device, and so on.

2. Related Art

In JP-A-6-125223 (Document 1), there is disclosed a Colpitts type quartz crystal oscillation circuit. The quartz crystal oscillation circuit includes an inverter, an output resistor, a feedback resistor, a quartz crystal vibrator, and a pair of capacitors. An input node of the inverter is coupled to an end of the quartz crystal vibrator, the output resistor is coupled between an output node of the inverter and the other end of the quartz crystal vibrator, the feedback resistor is coupled between the input node and the output node of the inverter, one of the pair of capacitors is disposed between the one end of the quartz crystal vibrator and a ground point, and the other of the pair of capacitors is disposed between the other end of the quartz crystal vibrator and the ground point.

In the oscillation of the oscillation circuit, an unwanted vibration occurs due to nonlinearity of the vibrator, and the unwanted vibration exerts an influence on the oscillation characteristics in some cases. It is possible to reduce the unwanted vibration by performing a low-drive oscillation, but there is a problem that a circuit configuration of performing the low-drive oscillation is not provided to the related art in Document 1 or the like.

SUMMARY

An aspect of the present disclosure relates to an oscillation circuit including a drive circuit to which a vibrator-output signal is input from one end of a vibrator, and which is configured to output a drive signal obtained by inverting the vibrator-output signal, and an amplitude limiting circuit which is disposed between an output node of the drive circuit and another end of the vibrator, and which outputs an amplitude-limited drive signal obtained by reducing an amplitude of the drive signal to the another end of the vibrator.

Another aspect of the present disclosure relates to a sensor device including the oscillation circuit described above, and the vibrator.

DESCRIPTION OF AN EXEMPLARY EMBODIMENT

A preferred embodiment of the present disclosure will hereinafter be described in detail. It should be noted that the embodiment described hereinafter does not unreasonably limit the content of the present disclosure as set forth in the appended claims, and all of the constituents described in the present embodiment are not necessarily essential constituents.

1. Oscillation Circuit

Figure 1:
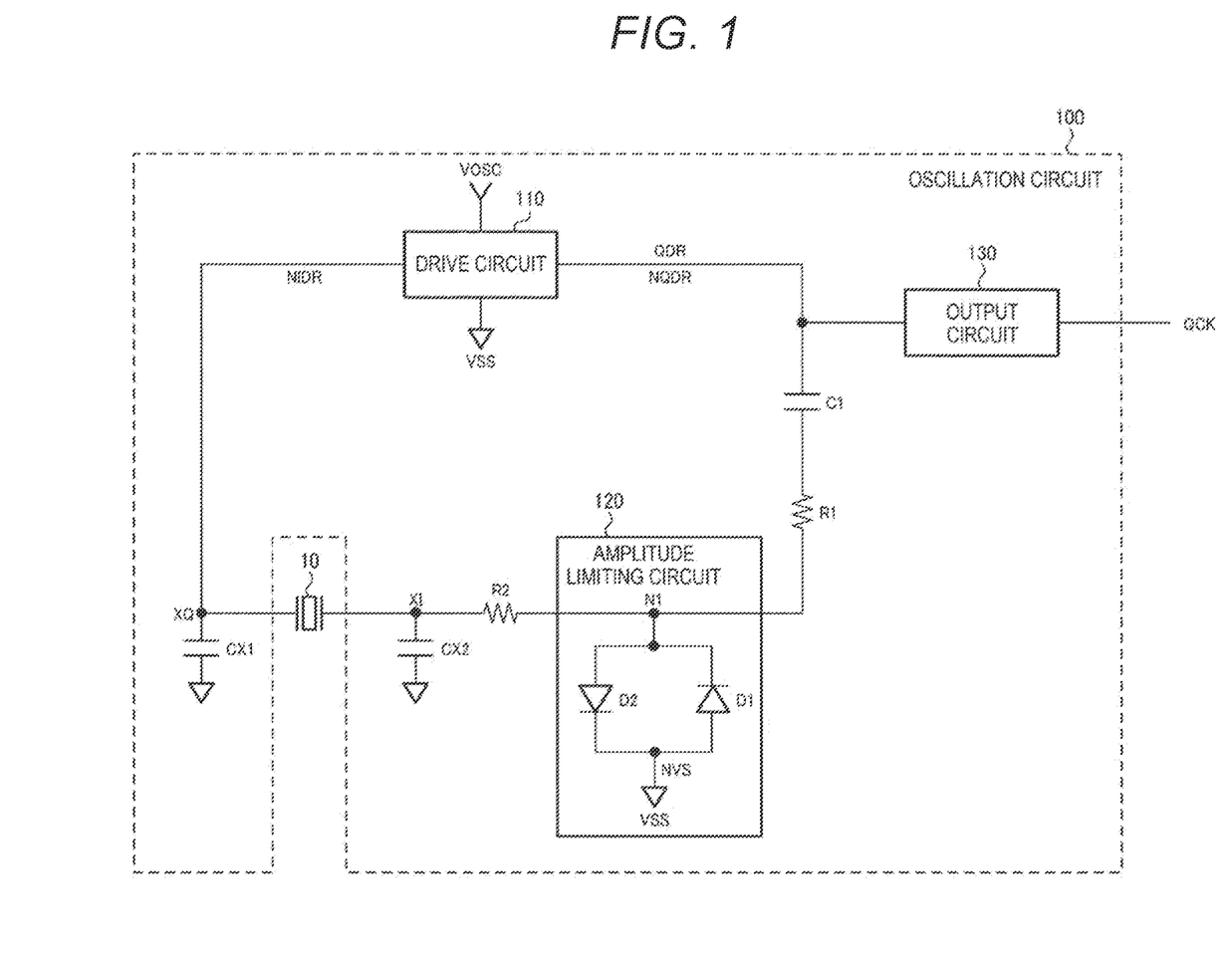
FIG. 1 is a diagram showing a configuration example of an oscillation circuit.

FIG. 1 shows a configuration example of an oscillation circuit 100 according to the present embodiment. The oscillation circuit 100 includes a drive circuit 110, an amplitude limiting circuit 120, an output circuit 130, a first capacitor C1, a first resistor R1, a second resistor R2, and capacitors CX1, CX2.

The oscillation circuit 100 drives a vibrator 10 to thereby oscillate the vibrator 10. One end of the capacitor CX1 is coupled to one end of the vibrator 10, and the other end of the capacitor CX1 is coupled to a ground node NVS. One end of the capacitor CX2 is coupled to the other end of the vibrator 10, and the other end of the capacitor CX2 is coupled to the ground node NVS. The ground node NVS is supplied with a ground voltage VSS. The oscillation circuit 100 inverts and amplifies a vibrator-output signal XQ input from the one end of the vibrator 10 to thereby output a vibrator-input signal XI to the other end of the vibrator 10. In other words, the oscillation circuit 100 is a Colpitts type oscillation circuit. The oscillation circuit 100 can be constituted by discrete circuit components, or can also be formed of an integrated circuit device in which circuit element are integrated on a semiconductor substrate. When the oscillation circuit 100 is an integrated circuit device, some circuit elements such as the capacitors CX1, CX2 can be external components of the integrated circuit device.

The vibrator 10 is a double tuning-fork quartz crystal vibrator described later with reference to FIG. 9. It should be noted that it is sufficient for the vibrator 10 to be a vibrator for generating an unwanted vibration in a high-drive oscillation. The unwanted vibration means a vibration with a frequency other than a desired oscillation frequency. The vibrator 10 is not limited to the quartz crystal vibrator, and can also be a piezoelectric vibrator such as a ceramic vibrator, or the vibrator 10 is not limited to the double tuning-fork type, and can also be a vibrator having a variety of shapes.

To the drive circuit 110, there is input the vibrator-output signal XQ from one end of the vibrator 10. The drive circuit 110 outputs a drive signal QDR obtained by inverting the vibrator-output signal XQ. The amplitude limiting circuit 120 is disposed between an output node NQDR of the drive circuit 110 and the other end of the vibrator 10. The amplitude limiting circuit 120 outputs an amplitude-limited drive signal QLM obtained by reducing the amplitude of the drive signal QDR to the other end of the vibrator 10.

Specifically, an input node NIDR of the drive circuit 110 is coupled to one end of the vibrator 10. The vibrator-output signal XQ is a signal output by the vibrator 10 in response to the drive by the oscillation circuit 100. The drive circuit 110 inverts and amplifies the vibrator-output signal XQ to thereby output the drive signal QDR reversed in phase with respect to the vibrator-output signal XQ. The amplitude of the drive signal QDR is VOSC/2 whereas the power supply voltage of the drive circuit 110 is VOSC. The amplitude limiting circuit 120 reduces the amplitude of the drive signal QDR to a level lower than VOSC/2 to output the amplitude-limited drive signal QLM. For example, the amplitude of the amplitude-limited drive signal QLM is no higher than a half of the amplitude of the drive signal QDR.

According to the present embodiment, by providing the amplitude limiting circuit 120, it is possible to reduce the amplitude of the signal for driving the vibrator 10. Thus, it is possible to reduce the unwanted vibration generated due to the nonlinearity of the vibrator to thereby reduce the influence exerted on the oscillation characteristics by the unwanted vibration.

Figure 2:
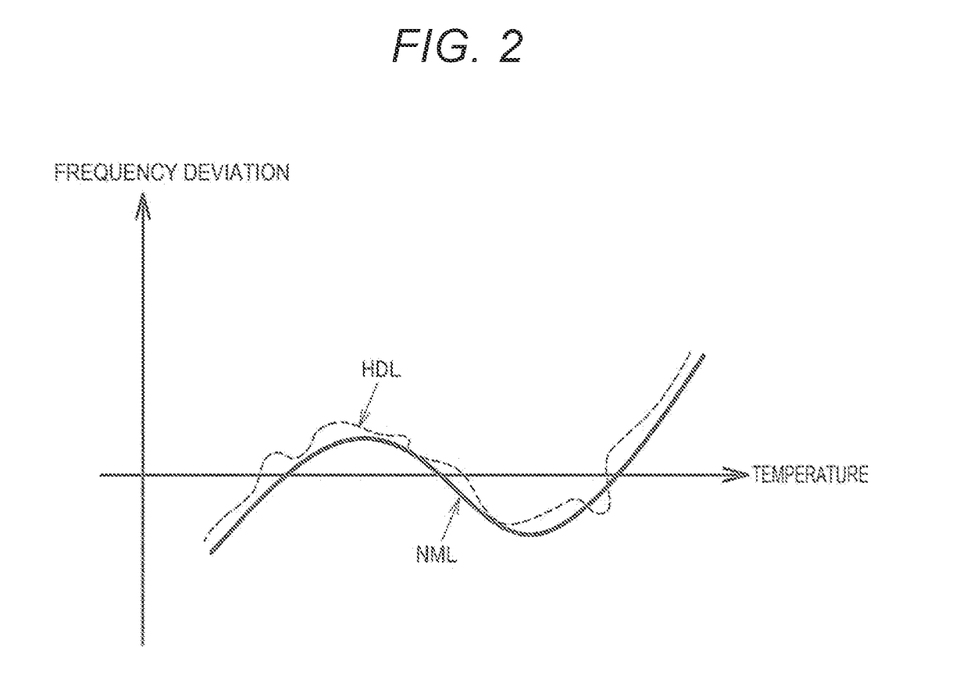
FIG. 2 is a diagram showing a temperature characteristic of a frequency deviation.

FIG. 2 shows the temperature characteristic of the frequency deviation as an example of an influence exerted on the oscillation characteristics by the unwanted vibration. It should be noted that although the three-dimensional temperature characteristic is illustrated here, the temperature characteristic differs in accordance with a type of the vibrator, and can be, for example, a two-dimensional temperature characteristic. In FIG. 2, the characteristic NML shows an ideal temperature characteristic. As shown in the characteristic HDL, when the unwanted vibration occurs due to the high-drive oscillation, the temperature characteristic is irregularly shifted from the ideal characteristic NML due to the unwanted vibration. Such a shift is also called a dip. For example, when using the vibrator 10 and the oscillation circuit 100 for a sensor device, the shift in the temperature characteristic exerts an influence on the detection accuracy of the physical quantity. Alternatively, when using the vibrator 10 and the oscillation circuit 100 for a temperature-compensated oscillator such as a TCXO, since the dip of the temperature characteristic cannot be compensated, the accuracy of the temperature compensation deteriorates.

In the present embodiment, by performing the low-drive oscillation, it is possible to make the temperature characteristic of the frequency deviation closer to the ideal characteristic NML. Thus, it is possible to increase the detection accuracy of, for example, the sensor device, or to increase the accuracy of the temperature compensation in the TCXO and so on.

It should be noted that the gain of the drive circuit 110 is set higher than the gain of a conventional drive circuit which is not provided with the amplitude limiting circuit 120. Thus, it becomes possible to enhance the stability of the oscillation in the low-drive oscillation, or to start up the oscillation circuit 100 even in the low drive. The detailed configuration example of the drive circuit 110 will be described later.

Then, the detailed configuration example of the amplitude limiting circuit 120, the first capacitor C1, the first resistor R1, the second resistor R2, and the output circuit 130 will be described.

The amplitude limiting circuit 120 includes a first diode D1 and a second diode D2. The first diode D1 and the second diode D2 are disposed between a first node N1 and a bias node. It should be noted that although FIG. 1 illustrates an example in which the bias node is the ground node NVS, it is sufficient for the bias node to be a node to be supplied with a constant voltage. The forward direction of the first diode D1 is a direction from the first node N1 toward the ground node NVS, and the forward direction of the second diode D2 is a direction from the ground node NVS toward the first node N1. In other words, the anode of the first diode D1 and the cathode of the second diode D2 are coupled to the first node N1, and the cathode of the first diode D1 and the anode of the second diode D2 are coupled to the ground node NVS.

The forward voltage of the first diode D1 and the second diode D2 is represented by Vf. According to the present embodiment, both of the first diode D1 and the second diode D2 are in an OFF state only when the voltage of the first node N1 is no lower than −Vf and no higher than +Vf centering on the voltage of the bias node. Thus, the voltage of the first node N1 is limited to a range no lower than −Vf and no higher than +Vf centering on the voltage of the bias node, and therefore, the amplitude of the amplitude-limited drive signal QLM at the first node N1 is limited to Vf. The power supply voltage VOSC of the drive circuit 110 is higher than 2×Vf, and the amplitude of the drive signal QDR is higher than Vf, but the first diode D1 and the second diode D2 limit the amplitude of the amplitude-limited drive signal QLM to Vf in such a manner as described above.

As described later with reference to FIG. 4, the signal the amplitude of which is limited by the first diode D1 and the second diode D2 becomes a rectangular wave. The amplitude-limited drive signal QLM as the rectangular wave includes components of a variety of frequencies in addition to the component of the oscillation frequency. Thus, since the vibrator 10 is actively excited at the start-up of the oscillation circuit 100, the oscillation circuit 100 is stably started up even in the state of the low drive.

The first capacitor C1 is disposed between the output node NQDR of the drive circuit 110 and the first mode N1 to which the amplitude limiting circuit 120 is coupled. The first resistor R1 is disposed between the output node NQDR of the drive circuit 110 and the first mode N1, and is coupled in series to the first capacitor C1. In other words, one end of the first capacitor C1 and the first resistor R1 coupled in series to each other is coupled to the output node NQDR, and the other end thereof is coupled to the first node N1. FIG. 1 shows an example in which the first capacitor C1 is coupled at the output node NQDR side, but it is possible for the first resistor R1 to be coupled at the output node NQDR side. The first resistor R1 is a resistor for a current limitation for limiting a current flowing through the amplitude limiting circuit 120. Specifically, the first resistor R1 limits a current flowing through the first diode D1 when the first diode D1 turns ON, and a current flowing through the second diode D2 when the second diode D2 turns ON.

Since the power supply voltage of the drive circuit is VOSC, the central voltage of the drive signal QDR becomes VOSC/2. According to the present embodiment, by the first capacitor C1 performing DC cut of the drive signal QDR, it is possible for the amplitude limiting circuit 120 to limit the amplitude-limited drive signal QLM to a voltage no lower than −Vf and no higher than +Vf centering on the ground voltage VSS. Further, when a current flows through the amplitude limiting circuit 120 beyond the current supply capacity of the drive circuit 110, there is a possibility that the drive circuit 110 fails to operate normally. According to the present embodiment, by the first resistor R1 limiting the current flowing when the first diode D1 or the second diode D2 turns ON, it is possible to prevent the current from flowing beyond the current supply capacity of the drive circuit 110.

The second resistor R2 is disposed between the first node N1 and the other end of the vibrator 10. In other words, one end of the second resistor R2 is coupled to the first node N1, and the other end thereof is coupled to the other end of the vibrator 10. The amplitude-limited drive signal QLM is input to the other end of the vibrator 10 as the vibrator-input signal XI via the second resistor R2. The second resistor R2 is a resistor for making a situation in which the first node N1 seems high-impedance when viewing the first node N1 from the other end of the vibrator 10.

Since the first node N1 becomes low-impedance when the first diode D1 or the second diode D2 turns ON, when the other end of the vibrator 10 and the first node N1 are directly coupled to each other, the resonance frequency of a resonant circuit constituted by the vibrator 10 and the capacitors CX1, CX2 is affected. According to the present embodiment, since the first node N1 seems high-impedance when viewed from the other end of the vibrator 10 due to the second resistor R2, the resonance frequency of the resonant circuit constituted by the vibrator 10 and the capacitors CX1, CX2 is not affected by the amplitude limiting circuit 120.

The output circuit 130 is a circuit for generating a clock signal QCK from the oscillation signal. In the present embodiment, the drive signal QDR is used as the oscillation signal. The output circuit 130 buffers the drive signal QDR to thereby output the clock signal QCK. The detailed configuration example of the output circuit 130 will be described later with reference to FIG. 8.

2. First Detailed Configuration Example

Figure 3:
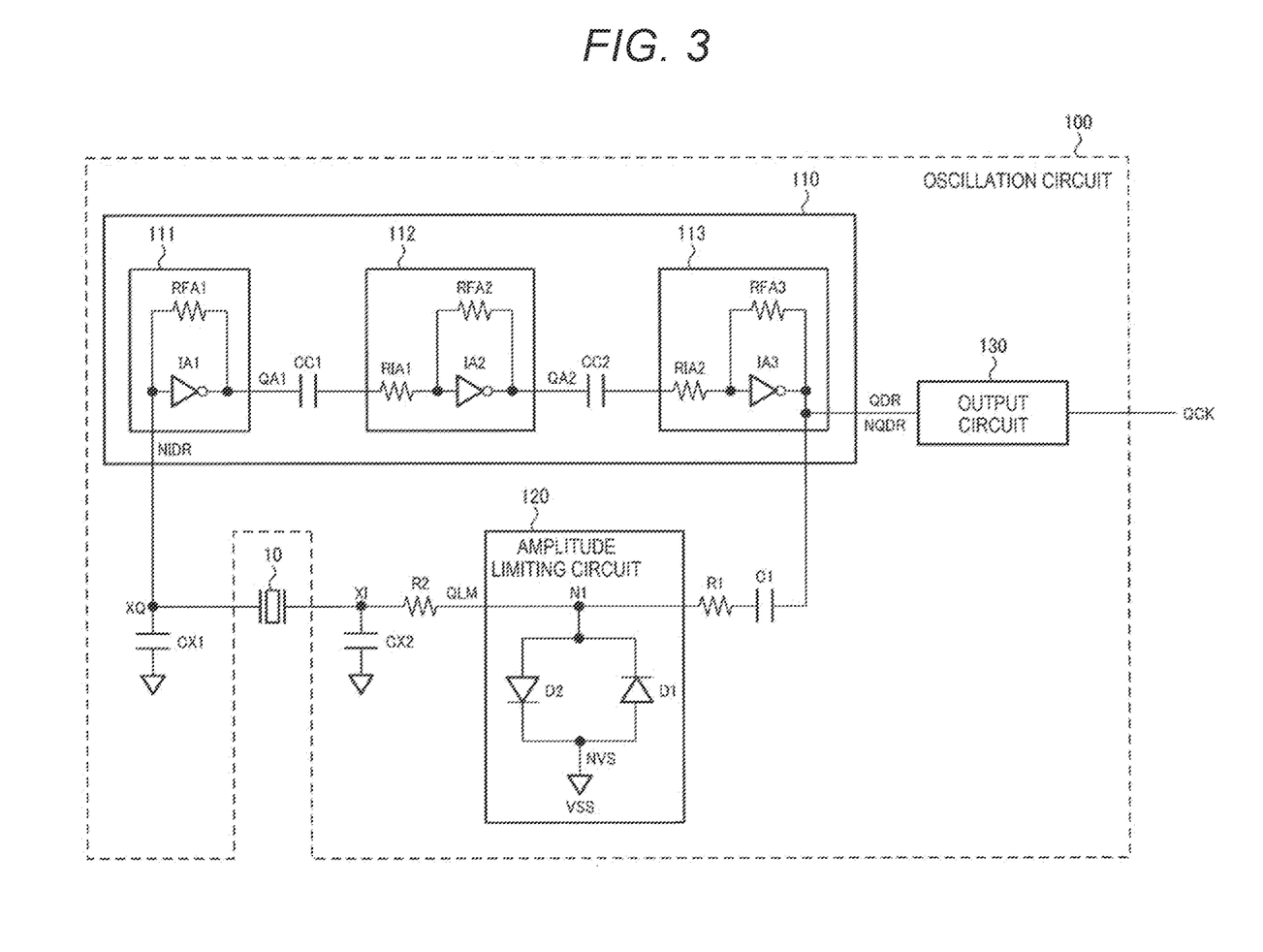
FIG. 3 is a diagram showing a first detailed configuration example of a drive circuit.

FIG. 3 shows a first detailed configuration example of the drive circuit 110. The drive circuit 110 includes a first amplifier circuit 111, a second amplifier circuit 112, a third amplifier circuit 113, a first coupling capacitor CC1, and a second coupling capacitor CC2. It should be noted that the constituents having already been described are denoted by the same reference numerals, and the description of such constituents will arbitrarily be omitted.

The vibrator-output signal XQ is input to the first amplifier circuit 111, and an output signal QA1 of the first amplifier circuit 111 is input to the second amplifier circuit 112. The first coupling capacitor CC1 is disposed between a first amplifier output node as an output node of the first amplifier circuit 111, and a second amplifier input node as an input node of the second amplifier circuit 112. Specifically, the first amplifier input node as the input node of the first amplifier circuit 111 is coupled to the input node NIDR of the drive circuit 110, the first amplifier output node is coupled to one end of the first coupling capacitor CC1, and the other end of the first coupling capacitor CC1 is coupled to the second amplifier input node.

According to the present embodiment, by the drive circuit 110 including two or more stages of amplifier circuits, it becomes easy to set the gain of the oscillation loop to a high gain. Thus, it becomes possible to enhance the stability of the oscillation in the low-drive oscillation, or to start up the oscillation circuit 100 even in the low drive. Further, the DC cut is performed on the output signal QA1 of the first amplifier circuit 111 by the first coupling capacitor CC1, and the result is input to the second amplifier circuit 112. Thus, since the DC drift of the output signal QA1 is cut, the amplification in the oscillation loop is prevented from being affected by the DC drift.

It should be noted that although the drive circuit 110 is constituted by the three stages of amplifier circuits in the first detailed configuration example, the number of stages of the drive circuit 110 is not limited to three, and it is sufficient for the drive circuit 110 to be an inverting amplifier circuit as a whole. For example, it is possible for the drive circuit 110 to be constituted by two stages of amplifier circuits as in a third detailed configuration example described later. Alternatively, the number of the stages of the amplifier circuits constituting the drive circuit 110 is not limited to no smaller than two, and it is possible for the drive circuit 110 to be formed of a single-stage high-gain inverting amplifier circuit.

In the first detailed configuration example, the first amplifier circuit 111 and the second amplifier circuit 112 have the following configuration. That is, the first amplifier circuit 111 includes a first inverter IA1 and a first feedback resistor RFA1. The first feedback resistor RFA1 is disposed between a first inverter output node as an output node of the first inverter IA1, and a first inverter input node as an input node of the first inverter IA1. The second amplifier circuit 112 includes a second inverter IA2, a second feedback resistor RFA2, and a first input resistor RIA1. The second feedback resistor RFA2 is disposed between a second inverter output node as an output node of the second inverter IA2, and a second inverter input node as an input node of the second inverter IA2. The first input resistor RIA1 is disposed between the second amplifier input node and the second inverter input node.

Further, in the first detailed configuration example, the drive circuit 110 includes the third amplifier circuit 113 and the second coupling capacitor CC2. To the third amplifier circuit 113, there is input an output signal QA2 of the second amplifier circuit 112. The second coupling capacitor CC2 is disposed between a second amplifier output node as an output node of the second amplifier circuit 112, and a third amplifier input node as an input node of the third amplifier circuit 113. In other words, the second amplifier output node is coupled to one end of the second coupling capacitor CC2, and the other end of the second coupling capacitor CC2 is coupled to the third amplifier input node. A third amplifier output node as an output node of the third amplifier circuit 113 is coupled to the output node NQDR of the drive circuit 110.

The third amplifier circuit 113 includes a third inverter IA3, a third feedback resistor RFA3, and a second input resistor RIA2. The third feedback resistor RFA3 is disposed between a third inverter output node as an output node of the third inverter IA3, and a third inverter input node as an input node of the third inverter IA3. The second input resistor RIA2 is disposed between the third amplifier input node and the third inverter input node.

According to the present embodiment, since the drive circuit 110 is constituted by the three stages of invertors, it is possible for the drive circuit 110 to invert and amplify the vibrator-output signal XQ with a high gain. Further, since the first input resistor RIA1 is disposed, it is possible to set the gain of the second amplifier circuit 112 using the ratio between the first input resistor RIA1 and the second feedback resistor RFA2. Similarly, since the second input resistor RIA2 is disposed, it is possible to set the gain of the third amplifier circuit 113 using the ratio between the second input resistor RIA2 and the third feedback resistor RFA3. Thus, it is possible to appropriately set the gain of the oscillation loop necessary when disposing the amplitude limiting circuit 120.

Figure 4:
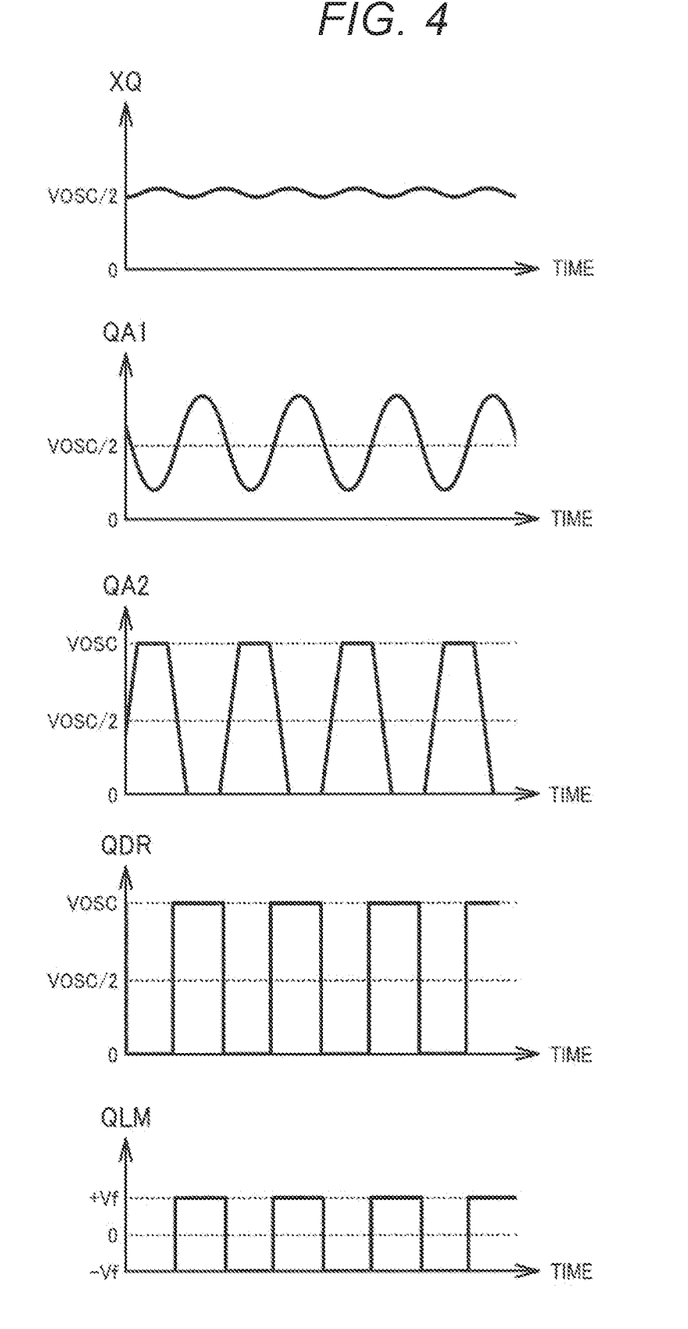
FIG. 4 is a diagram showing a signal waveform example in the oscillation circuit.

FIG. 4 shows signal waveform examples in the oscillation circuit 100 shown in FIG. 3. The vibrator-output signal XQ is a sine wave with a minute amplitude with the central voltage of VOSC/2, and the frequency thereof is the oscillation frequency of the vibrator 10.

The output signal QA1 of the first amplifier circuit 111 is a signal obtained by inverting and amplifying the vibrator-output signal XQ. In other words, the amplitude of the output signal QA1 is higher than the amplitude of the vibrator-output signal XQ, and the output signal QA1 is reversed in phase from the vibrator-output signal XQ.

The output signal QA2 of the second amplifier circuit 112 is a signal obtained by inverting and amplifying the output signal QA1 of the first amplifier circuit 111. In other words, the amplitude of the output signal QA2 is higher than the amplitude of the output signal QA1, and the output signal QA2 is in-phase with the vibrator-output signal XQ. It should be noted that the output signal QA2 becomes a rectangular wave clipped between the power supply voltage VOSC as an upper limit and the ground voltage VSS as a lower limit.

The drive signal QDR as an output signal of the third amplifier circuit 113 is a signal obtained by inverting and amplifying the output signal QA2 of the second amplifier circuit 112. Since the output signal QA2 is clipped, although the output signals QA3, QA2 are the same in amplitude, the output signal QA3 is steeper in voltage change. Further, the output signal QA3 is reversed in phase from the output signal QA2.

The amplitude-limited drive signal QLM is limited to the amplitude Vf centering on the ground voltage VSS=0 V. In other words, the amplitude-limited drive signal QLM is formed as a rectangular wave clipped between +Vf as an upper limit and −Vf as a lower limit. The amplitude-limited drive signal QLM as the rectangular wave includes components of a variety of frequencies in addition to the component of the oscillation frequency. Thus, since the vibrator 10 is actively excited at the start-up of the oscillation circuit 100, the oscillation circuit 100 is stably started up even in the state of the low drive.

3. Second Detailed Configuration Example

Figure 5:
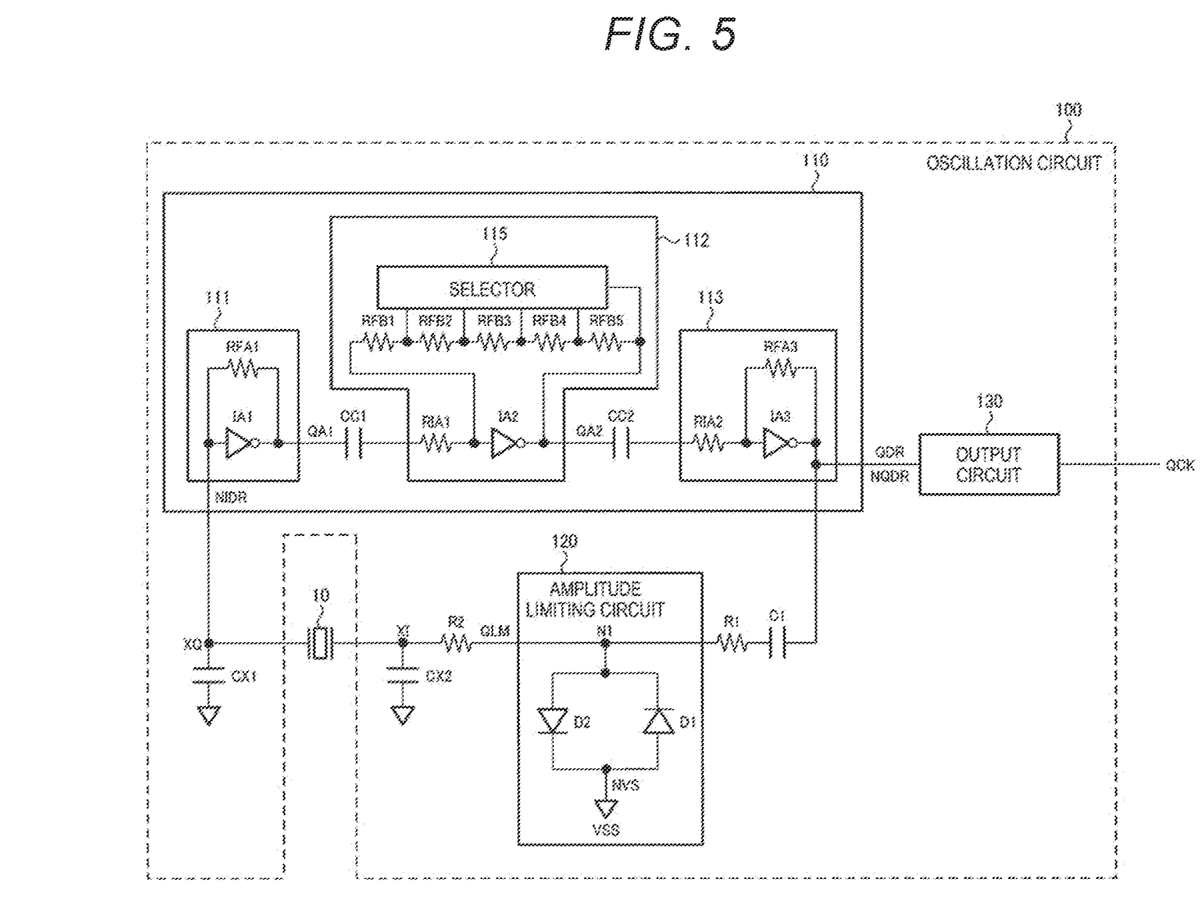
FIG. 5 is a diagram showing a second detailed configuration example of the drive circuit.

FIG. 5 shows a second detailed configuration example of the drive circuit 110. In the second detailed configuration example, the second amplifier circuit 112 includes the second inverter IA2, the first input resistor RIA1, a selector 115, and resistors RFB1 through RFB5. It should be noted that the constituents having already been described are denoted by the same reference numerals, and the description of such constituents will arbitrarily be omitted.

In the second detailed configuration example, the gain of the drive circuit 110 is variable. Specifically, the selector 115 and the resistors RFB1 through RFB5 constitute a variable resistor, and the variable resistor is used as the feedback resistor of the second inverter IA2. The resistors RFB1 through RFB5 are coupled in series to each other between the second inverter input node and the second inverter output node. The selector 115 selects one of the nodes between the resistors, and couple the node thus selected to the second inverter output node. The resistance value of the variable resistor is set in accordance with which one of the nodes between the resistors is selected.

Since the gain of the second amplifier circuit 112 is set using the ratio between the first input resistor RIA1 and the variable resistor, the gain of the second amplifier circuit 112 is variable. Thus, the gain of the drive circuit 110 is made variable. The CI-value of the vibrator 10 has an individual difference, and the gain of the oscillation loop perfect for the stable oscillation or start-up differs in accordance with the CI-value. According to the present embodiment, since the gain of the drive circuit 110 is variable, it is possible to set the appropriate gain of the oscillation loop in accordance with the individual difference of the CI-value. CI is an abbreviation for Crystal Impedance.

4. Third Detailed Configuration Example

Figure 6:
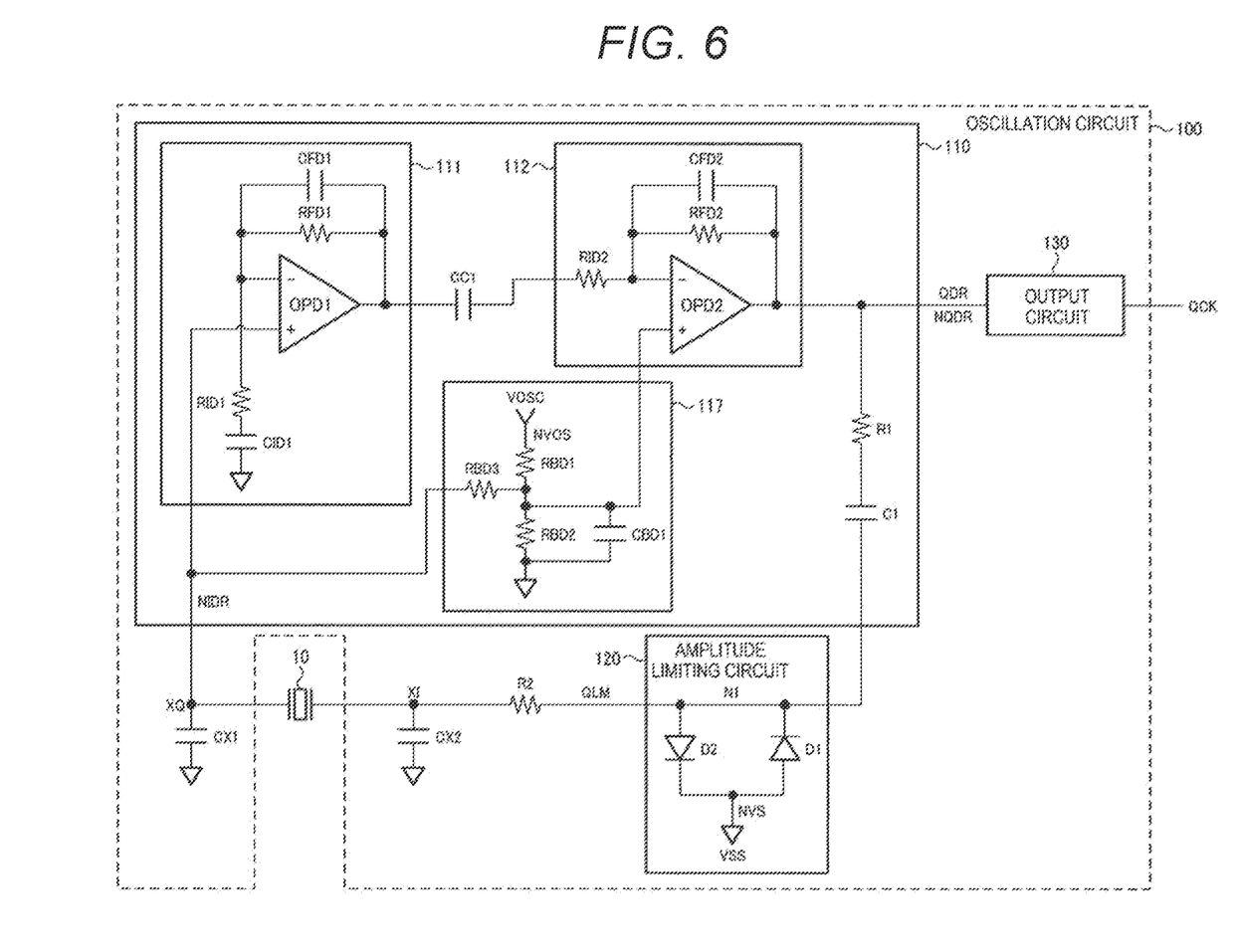
FIG. 6 is a diagram showing a third detailed configuration example of the drive circuit.

FIG. 6 shows a third detailed configuration example of the drive circuit 110. In the third detailed configuration example, the drive circuit 110 includes the first amplifier circuit 111, the second amplifier circuit 112, the first coupling capacitor CC1, and a biasing circuit 117.

The first amplifier circuit 111 is a noninverting amplifier circuit using an operational amplifier. The first amplifier circuit 111 includes an operational amplifier OPD1, a feedback resistor RFD1, a feedback capacitor CFD1, a resistor RID1, and a capacitor CID1.

The feedback resistor RFD1 and the feedback capacitor CFD1 are coupled in parallel to each other between an output node and an inverting input node of the operational amplifier OPD1. One end of the resistor RID1 is coupled to an inverting input node of the operational amplifier OPD1, and the other end is coupled to one end of the capacitor CID1. The other end of the capacitor CID1 is coupled to the ground node NVS. A noninverting input node of the operational amplifier OPD1 is coupled to the input node NIDR of the drive circuit 110, and to the noninverting input node of the operational amplifier OPD1, there is input the vibrator-output signal XQ biased by the biasing circuit 117. An output node of the operational amplifier OPD1 is the first amplifier output node, and is coupled to one end of the first coupling capacitor CC1.

The second amplifier circuit 112 is an inverting amplifier circuit using an operational amplifier. The second amplifier circuit 112 includes an operational amplifier OPD2, a feedback resistor RFD2, a feedback capacitor CFD2, and an input resistor RID2.

One end of the input resistor RID2 is coupled to the other end of the first coupling capacitor CC1, and the other end is coupled to an inverting input node of the operational amplifier OPD2. The feedback resistor RFD2 and the feedback capacitor CFD2 are coupled in parallel to each other between an output node and an inverting input node of the operational amplifier OPD2. To a noninverting input node of the operational amplifier OPD2, there is input a bias voltage from the biasing circuit 117. An output node of the operational amplifier OPD2 is the output node NQDR of the drive circuit 110, and is coupled to one end of the first resistor R1.

The biasing circuit 117 generates the bias voltage of VOSC/2 from the power supply voltage VOSC, and supplies the bias voltage to the input node NIDR of the drive circuit 110 and the noninverting input node of the operational amplifier OPD2. The biasing circuit 117 includes resistors RBD1, RBD2, and RBD3, and a capacitor CBD1.

The resistors RBD1, RBD2 are coupled in series to each other between the power supply voltage node NVOS and the ground node NVS. The power supply voltage node NVOS is a node supplied with the power supply voltage VOSC. The capacitor CBD1 is coupled in parallel to the resistor RBD2. The resistors RBD1, RBD2 are the same in resistance value, and the bias voltage of VOSC/2 is output to a node between the resistors RBD1, RBD2. Anode between the resistors RBD1, RBD2 is coupled to the noninverting input node of the operational amplifier OPD2. Further, the node between the resistors RBD1, RBD2 is coupled to the input node NIDR of the drive circuit 110 via the resistor RBD3. The resistor RBD3 has a high resistance value comparable with that of the second resistor R2 so that the biasing circuit 117 does not affect the resonance frequency by the vibrator 10 and the capacitors CX1, CX2.

In the present embodiment described hereinabove, at least one of the first amplifier circuit 111 and the second amplifier circuit 112 includes the operational amplifier, the feedback resistor disposed between the operational amplifier input node and the operational amplifier output node of the operational amplifier, and the feedback capacitor disposed between the operational amplifier input node and the operational amplifier output node. Citing the first amplifier circuit 111 as an example, OPD1 denotes the operational amplifier, the inverting input node of the operational amplifier is the operational amplifier input node, the output node of the operational amplifier is the operational amplifier output node, RFD1 denotes the feedback resistor, and CFD1 denotes the feedback capacitor. It should be noted that although FIG. 6 shows an example in which both of the first amplifier circuit 111 and the second amplifier circuit 112 each include the operational amplifier, the feedback resistor, and the feedback capacitor, it is sufficient for at least one of the first amplifier circuit 111 and the second amplifier circuit 112 to include the operational amplifier, the feedback resistor, and the feedback capacitor. For example, as a fourth detailed configuration example described later with reference to FIG. 7, it is possible for the first amplifier circuit 111 to be configured using an inverter. Alternatively, in the third detailed configuration example shown in FIG. 6, it is possible for the second amplifier circuit 112 as the inverting amplifier circuit to be configured using an inverter.

According to the present embodiment, by the drive circuit 110 including the amplifier circuit using an operational amplifier, it becomes easy to ensure the high gain of the oscillation loop necessary when using the amplitude limiting circuit 120. Further, by providing the feedback to the operational amplifier with the feedback resistor and the feedback capacitor, the amplifier circuit functions as a low-pass filter. A cutoff frequency of the low-pass filter is set higher than the oscillation frequency of the oscillation circuit 100, but is set to a frequency as low as possible so that unwanted frequencies are removed. Thus, since the components with the frequencies higher than the oscillation frequency are reduced, the oscillation characteristics can be improved.

5. Fourth Detailed Configuration Example

Figure 7:
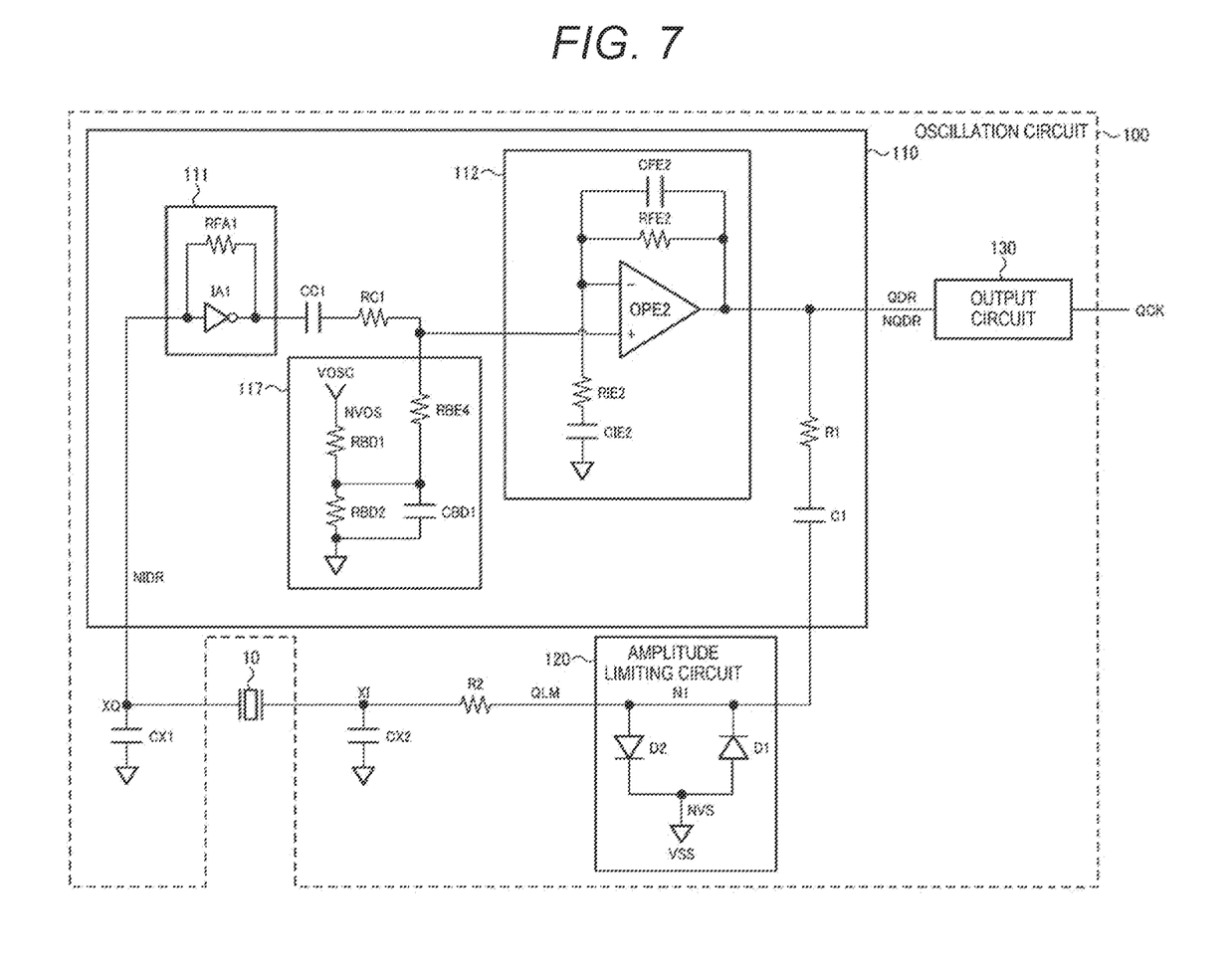
FIG. 7 is a diagram showing a fourth detailed configuration example of the drive circuit.

FIG. 7 shows the fourth detailed configuration example of the drive circuit 110. In the fourth detailed configuration example, the first amplifier circuit 111 is formed of an inverter, and the second amplifier circuit 112 is a noninverting amplifier circuit. It should be noted that the constituents having already been described are denoted by the same reference numerals, and the description of such constituents will arbitrarily be omitted.

Similarly to the first amplifier circuit 111 in the first detailed configuration example shown in FIG. 3, the first amplifier circuit 111 includes a first inverter IA1, and a first feedback resistor RFA1 disposed between a first inverter output node and a first inverter input node.

The second amplifier circuit 112 includes an operational amplifier OPE2, a feedback resistor RFE2, a feedback capacitor CFE2, a resistor RIE2, a capacitor CIE2, and a resistor RC1.

The feedback resistor RFE2 and the feedback capacitor CFE2 are coupled in parallel to each other between an output node and an inverting input node of the operational amplifier OPE2. One end of the resistor RIE2 is coupled to an inverting input node of the operational amplifier OPE2, and the other end is coupled to one end of the capacitor CIE2. The other end of the capacitor CIE2 is coupled to the ground node NVS. One end of the resistor RC1 is coupled to the other end of the first coupling capacitor CC1, and the other end is coupled to a noninverting input node of the operational amplifier OPE2. To the noninverting input node of the operational amplifier OPE2, there is input the output signal QA1 of the first amplifier circuit 111 biased by the biasing circuit 117. An output node of the operational amplifier OPE2 is the output node NQDR of the drive circuit 110, and is coupled to one end of the first resistor R1.

The biasing circuit 117 includes resistors RBD1, RBD2, and RBE4, and the capacitor CBD1. Similarly to the third detailed configuration example shown in FIG. 6, the bias voltage of VOSC/2 is generated by the resistors RBD1, RBD2. The node between the resistors RBD1, RBD2 is coupled to the noninverting input node of the operational amplifier OPE2 via the resistor RBE4. Thus, the central voltage of the signal to be input to the noninverting input node of the operational amplifier OPE2 is biased to VOSC/2.

6. Output Circuit

Figure 8:
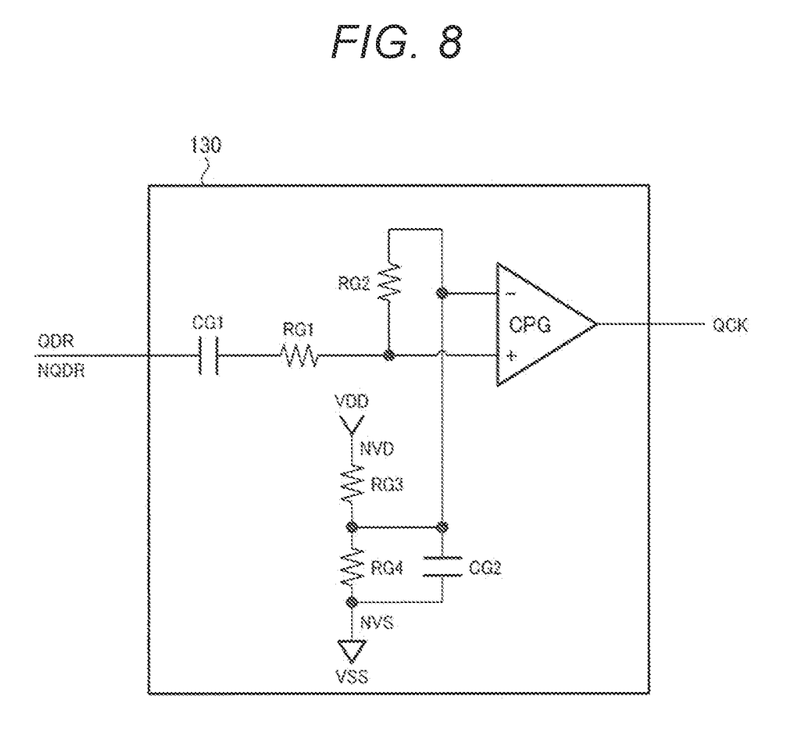
FIG. 8 is a diagram showing a detailed configuration example of an output circuit.

FIG. 8 shows a detailed configuration example of the output circuit 130. The output circuit 130 includes a comparator CPG, capacitors CG1, CG2, and resistors RG1 through RG4.

The resistors RG3, RG4 are coupled in series to each other between a power supply voltage node NVD and the ground node NVS. The power supply voltage node NVD is a node supplied with a power supply voltage VDD. The power supply voltage VDD can be different from the power supply voltage VOSC of the drive circuit 110, or can also be the same. The capacitor CG2 is coupled in parallel to the resistor RG4. The resistors RG3, RG4 are the same in resistance value, and the bias voltage of VDD/2 is output to a node between the resistors RG3, RG4.

One end of the capacitor CG1 is coupled to the output node NQDR of the drive circuit 110, and the other end is coupled to one end of the resistor RG1. The other end of the resistor RG1 is coupled to a noninverting input node of the comparator CPG. To an inverting input node of the comparator CPG, there is input the bias voltage of VDD/2. Further, the central voltage of the signal to be input to the noninverting input node of the comparator CPG is biased to VDD/2 via the resistor RG2. The drive signal QDR on which the DC cut is performed by the capacitor CG1 is biased so that the central voltage is VDD/2, and is then input to the noninverting input node of the comparator CPG. By the comparator CPG comparing the signal with VDD/2 at the inverting input node, the clock signal QCK is output.

7. Double Tuning-Fork Quartz Crystal Vibrator, Sensor Device

Figure 9:
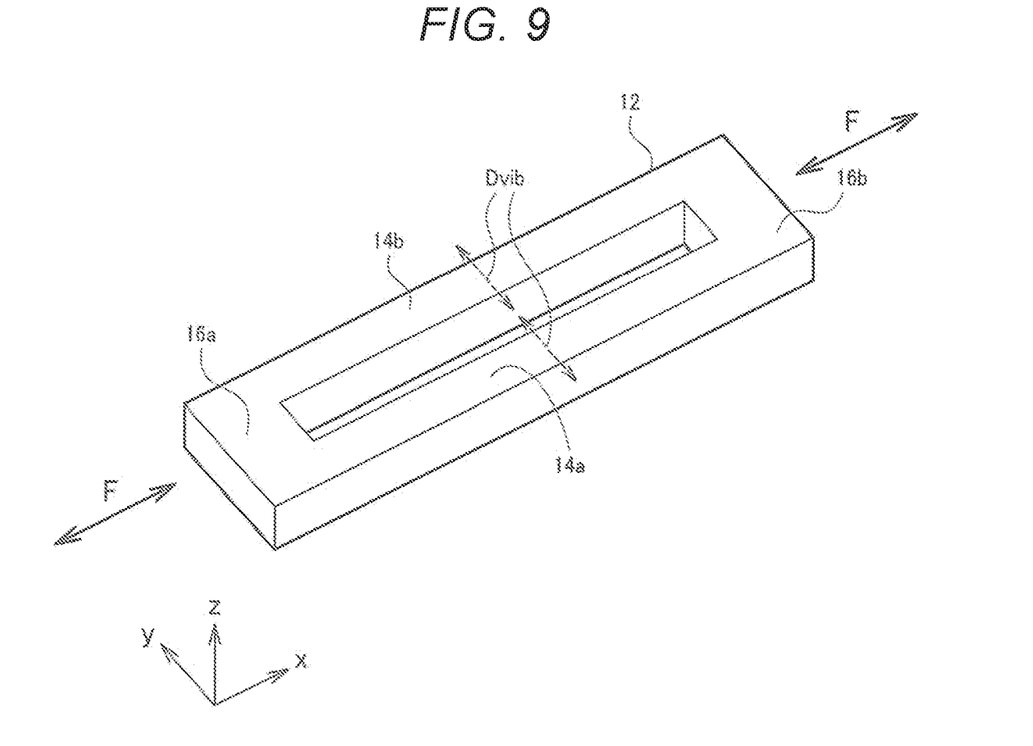
FIG. 9 is a diagram showing a configuration example of a double tuning-fork quartz crystal vibrator.

FIG. 9 shows a configuration example of the double tuning-fork quartz crystal vibrator 12 as an example of the vibrator 10. Three directions perpendicular to each other are defined as x, y, and z. Here, a direction parallel to a stress F for varying the oscillation frequency of the double tuning-fork quartz crystal vibrator 12 is assumed as an x direction. The double tuning-fork quartz crystal vibrator 12 has two vibrating parts 14a, 14b extending along the x direction. The vibrating parts 14a, 14b are arranged side by side in a y direction, and are parallel to each other when not vibrating.

One ends of the vibrating parts 14a, 14b are commonly coupled to a base part 16a, and the other ends are commonly coupled to a base part 16b. When the double tuning-fork quartz crystal vibrator 12 is driven by the oscillation circuit 100, the vibrating parts 14a, 14b vibrate in a vibration direction Dvib parallel to the y direction. The vibrating parts 14a, 14b vibrate so that the vibrating part 14b is displaced toward the −y direction when the vibrating part 14a is displaced toward the +y direction, and the vibrating part 14b is displaced toward the +y direction when the vibrating part 14a is displaced toward the −y direction.

When the stress F parallel to a z direction is applied to the double tuning-fork quartz crystal vibrator 12, the oscillation frequency of the double tuning-fork quartz crystal vibrator varies in accordance with the stress F. When the stress F in a direction of stretching the double tuning-fork quartz crystal vibrator 12 is applied, the oscillation frequency changes toward a higher frequency, and when the stress F in a direction of compressing the double tuning-fork quartz crystal vibrator 12 is applied, the oscillation frequency changes toward a lower frequency. By adopting the configuration in which the stress F changes in accordance with the physical quantity such as acceleration and pressure, the oscillation frequency changes in accordance with the physical quantity, and thus, it becomes possible to detect the physical quantity by detecting the oscillation frequency.

The double tuning-fork quartz crystal vibrator 12 has a characteristic of more dramatically reducing the unwanted vibration in the low-drive oscillation compared to that in the high-drive oscillation. Since it is possible for the oscillation circuit 100 according to the present embodiment to make the double tuning-fork quartz crystal vibrator 12 perform the low-drive oscillation, it is possible to reduce the unwanted vibration of the double tuning-fork quartz crystal vibrator 12. It should be noted that as described above, the vibrator 10 to which the oscillation circuit 100 according to the present embodiment can be applied is not limited to the double tuning-fork quartz crystal vibrator 12.

Figure 10:
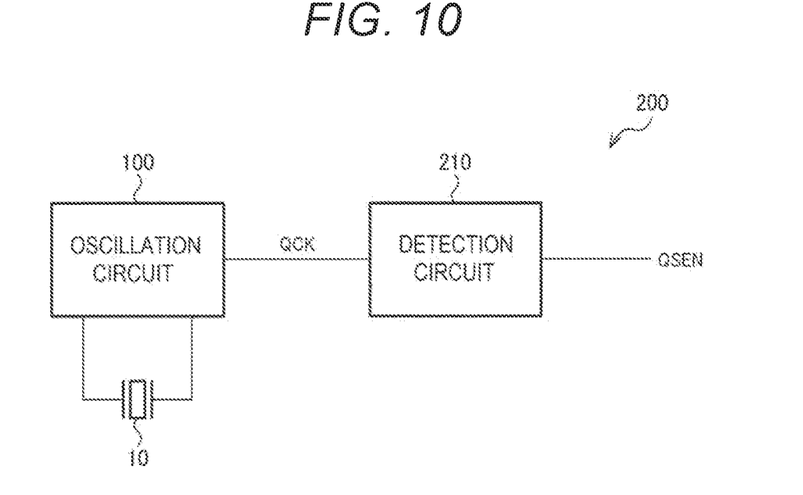
FIG. 10 is a diagram showing a configuration example of a sensor device.

FIG. 10 shows a configuration example of a sensor device 200 using the oscillation circuit 100. The sensor device 200 includes the oscillation circuit 100, the vibrator 10, and a detection circuit 210.

To the detection circuit 210, there is input the clock signal QCK from the oscillation circuit 100. The detection circuit 210 detects a physical quantity based on a change in oscillation frequency of the vibrator 10, and then outputs physical quantity information QSEN thus detected. The physical quantity information QSEN is, for example, physical quantity data corresponding to the detection value of the physical quantity. Although the configuration of the detection circuit 210 is variously assumed, as an example, the detection circuit 210 is a counter which counts the number of clock pulses of the clock signal QCK in a predetermined period, and then outputs the count value as the physical quantity information QSEN. The predetermined period is, for example, a period defined by a reference clock signal other than the clock signal QCK. By the oscillation frequency changing in accordance with the physical quantity, the count value measured by the counter also changes, and therefore, the physical quantity can be detected by the count value.

It is sufficient for the physical quantity to be detected by the sensor device 200 to be a physical quantity which applies a stress to the vibrator 10. The physical quantity is, for example, acceleration, gravitational acceleration, hydraulic pressure, atmospheric pressure, or stress acting on an object. Further, it is possible to adopt a physical quantity which can be obtained by the sensor device 200 performing a conversion process on a physical quantity exerting stress on the vibrator 10. For example, the vibrator 10 detects acceleration, and the detection circuit 210 can integrate the acceleration to thereby detect velocity or a position as the physical quantity.

The oscillation circuit explained in the present embodiment described hereinabove includes the drive circuit and the amplitude limiting circuit. The vibrator-output signal is input to the drive circuit from one end of the vibrator, and the drive circuit outputs a drive signal obtained by inverting the vibrator-output signal. The amplitude limiting circuit is disposed between the output node of the drive circuit and the other end of the vibrator, and outputs the amplitude-limited drive signal obtained by reducing the amplitude of the drive signal to the other end of the vibrator.

According to the present embodiment, by disposing the amplitude limiting circuit between the output node of the drive circuit and the other end of the vibrator, it is possible to reduce the amplitude of the signal for driving the vibrator. Thus, it is possible to reduce the unwanted vibration generated due to the nonlinearity of the vibrator to thereby reduce the influence exerted on the oscillation characteristics by the unwanted vibration.

Further, the oscillation circuit according to the present embodiment can include the first capacitor. The first capacitor can be disposed between the output node of the drive circuit and the first node to which the amplitude limiting circuit is coupled.

According to the present embodiment, by the first capacitor performing the DC cut on the drive signal, it is possible for the amplitude limiting circuit to limit the amplitude of the amplitude-limited drive signal to a predetermined amplitude centering on an arbitrary bias voltage.

Further, in the present embodiment, it is possible for the amplitude limiting circuit to include the first diode and the second diode. The first diode is disposed between the first node and the bias node, and it is possible to set the direction from the first node toward the bias node to the forward direction. The second diode is disposed between the first node and the bias node, and it is possible to set the direction from the bias node toward the first node to the forward direction.

The forward voltage of the first diode and the second diode is represented by Vf. According to the present embodiment, both of the first diode and the second diode are in the OFF state only when the voltage of the first node is no lower than −Vf and no higher than +Vf centering on the voltage of the bias node. Thus, the voltage of the first node is limited to a range no lower than −Vf and no higher than +Vf centering on the voltage of the bias node, and therefore, the amplitude of the amplitude-limited drive signal at the first node is limited to Vf.

Further, the oscillation circuit according to the present embodiment can include the first resistor. The first resistor can be a resistor for the current limitation which is disposed between the output node of the drive circuit and the first node, and is coupled in series to the first capacitor.

When a current flows through the amplitude limiting circuit beyond the current supply capacity of the drive circuit, there is a possibility that the drive circuit fails to operate normally. According to the present embodiment, by the first resistor limiting the current flowing when the first diode or the second diode turns ON, it is possible to prevent the current from flowing beyond the current supply capacity of the drive circuit.

Further, the oscillation circuit according to the present embodiment can include the second resistor. The second resistor can be disposed between the first node and the other end of the vibrator.

Since the node becomes low-impedance when the first diode or the second diode turns ON, when the other end of the vibrator and the first node are directly coupled to each other, the resonance frequency of a resonant circuit constituted by the vibrator is affected. According to the present embodiment, due to the second resistor, it is possible to make the impedance when viewing the first node from the other end of the vibrator high-impedance.

Further, in the present embodiment, it is possible for the drive circuit to include the first amplifier circuit to which the vibrator-output signal is input, the second amplifier circuit to which the output signal of the first amplifier circuit is input, and the first coupling capacitor disposed between the first amplifier output node of the first amplifier circuit and the second amplifier input node of the second amplifier circuit.

According to the present embodiment, by the drive circuit including two or more stages of amplifier circuits, it becomes easy to set the gain of the oscillation loop to a high gain. Thus, it becomes possible to enhance the stability of the oscillation in the low-drive oscillation, or to start up the oscillation circuit even in the low drive.

Further, in the present embodiment, it is possible for the first amplifier circuit to include the first inverter, and the first feedback resistor disposed between the first inverter output node and the first inverter input node of the first inverter. It is possible for the second amplifier circuit to include the second inverter, the second feedback resistor disposed between the second inverter output node and the second inverter input node of the second inverter, and the first input resistor disposed between the second amplifier input node and the second inverter input node.

According to the present embodiment, since the drive circuit can be configured using the two or more stages of the inverters, it is possible to make the oscillation loop higher-gain than when configuring the drive circuit with a single stage inverter. Further, since the first input resistor is disposed, it is possible to set the gain of the second amplifier circuit using the ratio between the first input resistor and the second feedback resistor. Thus, it is possible to appropriately set the gain of the oscillation loop necessary when disposing the amplitude limiting circuit.

Further, in the present embodiment, it is possible for the drive circuit to include the third amplifier circuit to which the output signal of the second amplifier circuit is input, and the second coupling capacitor disposed between the second amplifier output node of the second amplifier circuit and the third amplifier input node of the third amplifier circuit. It is possible for the third amplifier circuit to include the third inverter, the third feedback resistor disposed between the third inverter output node and the third inverter input node of the third inverter, and the second input resistor disposed between the third amplifier input node and the third inverter input node.

According to the present embodiment, since the drive circuit is constituted by the three stages of invertors, it is possible for the drive circuit to invert and amplify the vibrator-output signal with a high gain. Further, since the second input resistor is disposed, it is possible to set the gain of the third amplifier circuit using the ratio between the second input resistor and the third feedback resistor. Thus, it is possible to appropriately set the gain of the oscillation loop necessary when disposing the amplitude limiting circuit.

Further, in the present embodiment, it is possible for at least one of the first amplifier circuit and the second amplifier circuit to include the operational amplifier, the feedback resistor disposed between the operational amplifier input node and the operational amplifier output node of the operational amplifier, and the feedback capacitor disposed between the operational amplifier input node and the operational amplifier output node.

According to the present embodiment, by the drive circuit including the amplifier circuit using the operational amplifier, it becomes easy to ensure the high gain of the oscillation loop necessary when using the amplitude limiting circuit. Further, by providing the feedback to the operational amplifier with the feedback resistor and the feedback capacitor, the amplifier circuit functions as a low-pass filter. Thus, since the components with the frequencies higher than the oscillation frequency are reduced, the oscillation characteristics can be improved.

Further, in the present embodiment, the gain of the drive circuit can be variable.

The CI-value of the vibrator has an individual difference, and the gain of the oscillation loop perfect for the stable oscillation or start-up differs in accordance with the CI-value. According to the present embodiment, since the gain of the drive circuit is variable, it is possible to set the appropriate gain of the oscillation loop in accordance with the individual difference of the CI-value.

Further, in the present embodiment, the vibrator can be a double tuning-fork quartz crystal vibrator.

The double tuning-fork quartz crystal vibrator has a characteristic of more dramatically reducing the unwanted vibration in the low-drive oscillation compared to that in the high-drive oscillation. Since it is possible for the oscillation circuit according to the present embodiment to make the double tuning-fork quartz crystal vibrator perform the low-drive oscillation, it is possible to reduce the unwanted vibration of the double tuning-fork quartz crystal vibrator.

Further, the sensor device according to the present embodiment includes any one of the oscillation circuits described above and the vibrator.

Further, the sensor device according to the present embodiment can include the detection circuit for detecting a physical quantity based on a change in the oscillation frequency of the vibrator.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with the different term in any part of the specification or the accompanying drawings. Further, all of the combinations of the present embodiment and the modified examples are also included in the scope of the present disclosure. Further, the configurations and the operations of the oscillation circuit, the vibrator, and the sensor device are not limited to those explained in the present embodiment, but can be implemented with a variety of modifications.

What is claimed is:

1. An oscillation circuit comprising:
   a drive circuit to which a vibrator-output signal is input from one end of a vibrator, and which is configured to output a drive signal obtained by inverting the vibrator-output signal;
   an amplitude limiting circuit which is disposed between an output node of the drive circuit and another end of the vibrator, and which outputs an amplitude-limited drive signal obtained by reducing an amplitude of the drive signal to the another end of the vibrator;
   a first capacitor disposed between the output node of the drive circuit and a first node to which the amplitude limiting circuit is coupled; and
   a first resistor for current limitation disposed between the output node of the drive circuit and the first node to be coupled in series to the first capacitor.

2. The oscillation circuit according to claim 1, wherein the amplitude limiting circuit includes
   a first diode which is disposed between the first node and a bias node, and which has a direction from the first node toward the bias node as a forward direction, and
   a second diode which is disposed between the first node and the bias node, and which has a direction from the bias node toward the first node as a forward direction.

3. The oscillation circuit according to claim 1, further comprising:
   a second resistor disposed between the first node and the another end of the vibrator.

4. The oscillation circuit according to claim 1, wherein the drive circuit includes
   a first amplifier circuit to which the vibrator-output signal is input,
   a second amplifier circuit to which an output signal of the first amplifier circuit is input, and
   a first coupling capacitor disposed between a first amplifier output node of the first amplifier circuit and a second amplifier input node of the second amplifier circuit.

5. The oscillation circuit according to claim 4, wherein the first amplifier circuit includes
   a first inverter, and
   a first feedback resistor disposed between a first inverter output node and a first inverter input node of the first inverter, and
   the second amplifier circuit includes
   a second inverter,
   a second feedback resistor disposed between a second inverter output node and a second inverter input node of the second inverter, and
   a first input resistor disposed between the second amplifier input node and the second inverter input node.

6. The oscillation circuit according to claim 5, wherein the drive circuit includes
   a third amplifier circuit to which an output signal of the second amplifier circuit is input, and
   a second coupling capacitor disposed between a second amplifier output node of the second amplifier circuit and a third amplifier input node of the third amplifier circuit, and
   the third amplifier circuit includes
   a third inverter,
   a third feedback resistor disposed between a third inverter output node and a third inverter input node of the third inverter, and
   a second input resistor disposed between the third amplifier input node and the third inverter input node.

7. The oscillation circuit according to claim 4, wherein at least one of the first amplifier circuit and the second amplifier circuit includes
   an operational amplifier,
   a feedback resistor disposed between an operational amplifier input node and an operational amplifier output node of the operational amplifier, and
   a feedback capacitor disposed between the operational amplifier input node and the operational amplifier output node.

8. The oscillation circuit according to claim 1, wherein a gain of the drive circuit is variable.

9. The oscillation circuit according to claim 1, wherein the vibrator is a double tuning-fork quartz crystal vibrator.

10. A sensor device comprising:
    the oscillation circuit according to claim 1; and
    the vibrator.

11. The sensor device according to claim 10, further comprising:
    a detection circuit configured to detect a physical quantity based on a change in an oscillation frequency of the vibrator.

12. An oscillation circuit comprising:
    a drive circuit to which a vibrator-output signal is input from one end of a vibrator, and which is configured to output a drive signal obtained by inverting the vibrator-output signal; and
    an amplitude limiting circuit which is disposed between an output node of the drive circuit and another end of the vibrator, and which outputs an amplitude-limited drive signal obtained by reducing an amplitude of the drive signal to the another end of the vibrator, wherein
    the drive circuit includes
    a first amplifier circuit to which the vibrator-output signal is input,
    a second amplifier circuit to which an output signal of the first amplifier circuit is input, and
    a first coupling capacitor disposed between a first amplifier output node of the first amplifier circuit and a second amplifier input node of the second amplifier circuit.

13. The oscillation circuit according to claim 12, wherein the first amplifier circuit includes
    a first inverter, and
    a first feedback resistor disposed between a first inverter output node and a first inverter input node of the first inverter, and
    the second amplifier circuit includes
    a second inverter,
    a second feedback resistor disposed between a second inverter output node and a second inverter input node of the second inverter, and
    a first input resistor disposed between the second amplifier input node and the second inverter input node.

14. The oscillation circuit according to claim 13, wherein the drive circuit includes
- a third amplifier circuit to which an output signal of the second amplifier circuit is input, and
- a second coupling capacitor disposed between a second amplifier output node of the second amplifier circuit and a third amplifier input node of the third amplifier circuit, and the third amplifier circuit includes
- a third inverter,
- a third feedback resistor disposed between a third inverter output node and a third inverter input node of the third inverter, and
- a second input resistor disposed between the third amplifier input node and the third inverter input node.

15. The oscillation circuit according to claim 12, wherein at least one of the first amplifier circuit and the second amplifier circuit includes
- an operational amplifier,
- a feedback resistor disposed between an operational amplifier input node and an operational amplifier output node of the operational amplifier, and
- a feedback capacitor disposed between the operational amplifier input node and the operational amplifier output node.

16. The oscillation circuit according to claim 12, further comprising:
- a first capacitor disposed between the output node of the drive circuit and a first node to which the amplitude limiting circuit is coupled.

17. The oscillation circuit according to claim 16, wherein the amplitude limiting circuit includes
- a first diode which is disposed between the first node and a bias node, and which has a direction from the first node toward the bias node as a forward direction, and
- a second diode which is disposed between the first node and the bias node, and which has a direction from the bias node toward the first node as a forward direction.

18. The oscillation circuit according to claim 16, further comprising:
- a first resistor for current limitation disposed between the output node of the drive circuit and the first node to be coupled in series to the first capacitor; and
- a second resistor disposed between the first node and the another end of the vibrator.

* * * * *